United States Patent [19]
Molnar

[11] Patent Number: 6,086,673
[45] Date of Patent: *Jul. 11, 2000

[54] PROCESS FOR PRODUCING HIGH-QUALITY III-V NITRIDE SUBSTRATES

[75] Inventor: Richard J. Molnar, Harvard, Mass.

[73] Assignee: Massachusetts Institute of Technology, Cambridge, Mass.

[*] Notice: This patent issued on a continued prosecution application filed under 37 CFR 1.53(d), and is subject to the twenty year patent term provisions of 35 U.S.C. 154(a)(2).

[21] Appl. No.: 09/054,097

[22] Filed: Apr. 2, 1998

Related U.S. Application Data

[60] Provisional application No. 60/042,587, Apr. 3, 1997, and provisional application No. 60/048,304, May 30, 1997.

[51] Int. Cl.$^7$ .................................................. C30B 25/16
[52] U.S. Cl. ................................ 117/90; 117/84; 117/93; 117/102; 117/104; 117/105
[58] Field of Search .................................... 117/84, 90, 93, 117/102, 104, 105

[56] References Cited

U.S. PATENT DOCUMENTS

| | | | |
|---|---|---|---|
| 4,522,661 | 6/1985 | Morrison et al. | 148/33.2 |
| 4,855,249 | 8/1989 | Akasaki et al. | 437/81 |
| 5,217,564 | 6/1993 | Bozler et al. | 156/620.71 |
| 5,273,616 | 12/1993 | Bozler et al. | 156/603 |
| 5,328,549 | 7/1994 | Bozler et al. | 437/226 |

(List continued on next page.)

FOREIGN PATENT DOCUMENTS

| | | | |
|---|---|---|---|
| 0647730 | 10/1994 | European Pat. Off. | C30B 29/38 |
| 224341 | 7/1985 | Germany | C30B 25/02 |
| 9520695 | 8/1995 | WIPO | C30B 33/08 |

OTHER PUBLICATIONS

Gotz et al., "Electronic and structural properties of GaN grown by hydride vapor phase epitaxy," *Appl. Phys. Lett*, vol. 69, No. 2, pp. 242–244, Jul. 8, 1996.

Molnar et al., "Hydride Vapor Phase Epitaxy of Gallium Nitride Films for Quasi–Bulk Substrates," 189th Meeting of Electrochemical Society—1st Symposium on III–Nitrides: Materials and Device Processing, May 5–10, 1996.

Gotz et al., "Characterization of the Electrical Properties of GaN Grown by Hydride Vapor Phase Epitaxy," ICPS–96, Berlin, Germany, Jul. 21–26, 1996.

(List continued on next page.)

*Primary Examiner*—Felisa Hiteshew
*Attorney, Agent, or Firm*—Theresa A. Lober

[57] ABSTRACT

Provided is a method for producing a nitride layer on a growth substrate. First a pretreatment layer is formed on the growth substrate, and then the formed pretreatment layer is exposed to a gaseous environment that is thermochemically reactive with the pretreatment layer. After gaseous environment exposure of the pretreatment layer, there is carried out an epitaxial growing process to produce on the substrate a nitride layer material defined as $In_xGa_yAl_{1-x-y}N$, where $0 \leq x \leq 1$; $0 \leq y \leq 1$; and $0 \leq x+y \leq 1$. For example, a pretreatment layer of ZnO can be deposited on a sapphire growth substrate and then subjected to a gaseous environment, e.g., including HCl- and/or $NH_3$-containing gas, that is thermochemically reactive with the ZnO. Then an epitaxial layer of GaN can be grown by a hydride vapor phase epitaxial process on the pretreated substrate. The growth substrate can include a plane of mechanical weakness that is parallel with a predominant nitride growth surface of the substrate, and that is either inherently exhibited by the substrate or that is produced by processing of the substrate. Similarly, an interlayer of material characterized by a plane of mechanical weakness parallel with the predominant nitride growth surface can be formed on the substrate, preferably after the pretreatment layer deposition and gaseous environment exposure steps.

14 Claims, 1 Drawing Sheet

U.S. PATENT DOCUMENTS

| | | | |
|---|---|---|---|
| 5,362,682 | 11/1994 | Bozler et al. | 437/226 |
| 5,587,014 | 12/1996 | Iyechika et al. | 117/90 |
| 5,588,994 | 12/1996 | Bozler et al. | 117/89 |
| 5,604,763 | 2/1997 | Kato et al. | 372/45 |
| 5,620,557 | 4/1997 | Manabe et al. | 438/507 |
| 5,633,192 | 5/1997 | Moustakas et al. | 438/46 |
| 5,670,798 | 9/1997 | Schetzina | 257/96 |
| 5,701,321 | 12/1997 | Hayafuji et al. | 372/44 |
| 5,846,844 | 12/1998 | Akasaki et al. | 437/580 |

OTHER PUBLICATIONS

Gotz et al., "Thickness–Dependence of Electronic Properties of GaN EPI–Layers," *Mat. Res. Soc. Symp. Proc.*, vol. 449, pp. 525–530, 1997.

Molnar et al., "Growth of galluim nitride by hydride vapor–phase epitaxy," *Journal of Crystal Growth*, vol. 178, pp. 147–156, 1997.

Look et al., "Degenerate layer at GaN/sapphire interface: influence on Hall–effect measurements," *Appl. Phys. Lett.*, vol. 70, No. 25 pp. 3377–3379, Jun. 23, 1997.

Romano et al., "Structure of GaN films grown by hydride vapor phase epitaxy," *Appl. Phys. Lett.*, vol. 71, No. 16, pp. 2283–2285, Oct. 20, 1997.

Vennegues et al., "Influence of in situ sapphire surface preparation and carrier gas on the growth mode of GaN in MOVPE," *Journal of Crystal Growth*, vol. 187, pp. 167–177, 1998.

Gotz et al., "Hall–effect analysis of GaN films grown by hydride vapor phase epitaxy," *App. Phys. Lett.*, vol. 72, No. 10, pp. 1214–1216, Mar. 9, 1998.

Molnar, "Hydride Vapor Phase Epitaxial Growth of III–V Nitrides," *Semiconductors and Semimetal*, vol. 57, Chapter 1, pp. 1–31, Mar. 18, 1998.

Amano et al., "The growth of thick GaN film on sapphire substrate by using ZnO buffer layer," *Journal of Crystal Growth*, vol. 128, pp. 384–390, 1993.

Detchprohm et al., "Hydride vapor phase epitaxial growth of a high quality GaN film using a ZnO buffer layer," *Appl. Phys. Lett.*, vol. 61, No. 22, pp. 2688–2690, Nov. 30, 1992.

Molnar et al., "Gallium Nitride Thick Films Grown by Hydride Vapor Phase Epitaxy," *Mat. Res. Soc. Symp. Proc.*, vol. 423, pp. 221–226, 1996.

Romano et al., "Structrual Characterization of Thick GaN Films Grown by Hydride Vapor Phase Epitaxy," *Mat. Res. Soc. Symp. Proc.*, vol. 423, pp.245–250, 1996.

Detchprohm et al., "The selective growth in hydride vapor phase epitaxy of GaN," *Inst. Phys. Conf.*, Serial No. 142, Chapter 5, pp. 859–862, 1996.

Molnar et al., "The Role of Impurities in Hydride Vapor Phase Epitaxially Grown Gallium Nitride," *Mat. Re. Soc. Symp. Proc.*, vol. 378, pp. 479–484, 1995.

Molnar et al., "Optoelectronic and Structural Properties of High–Quality GaN Grown by Hydride Vapor Phase Epitaxy," *Mat. REs. Soc. Symp. Proc.*, vol. 395, pp. 189–194, 1996.

Molnar et al., "The Effect of Growth Parameters on the Quality of Gallium Nitride Thick Films Grown by Hydride Vapor Phase Epitaxy," MRS 1996 Spring Meeting Abstracts pp. 100, Apr. 8–12, 1996.

FIG. 1

PROCESS FOR PRODUCING HIGH-QUALITY III–V NITRIDE SUBSTRATES

This application claims the benefit of U.S. Provisional Application No. 60/042,587, filed Apr. 3, 1997, and further claims the benefit of U.S. Provisional Application No. 60/048,304, filed May 30, 1997, both applications in the name of Molnar, and the entirety of both of which are hereby incorporated by reference.

GOVERNMENT RIGHTS IN THE INVENTION

This invention was made with U.S. Government support under U.S. Air Force Contract Number F19628-95C-0002 and DARPA Contract Number 506-8-201. The U.S. Government has certain rights in this invention.

BACKGROUND OF THE INVENTION

This invention relates to III–V semiconductor materials, and more particularly relates to processes for producing III–V nitride substrate materials.

As the practical realization of the theoretical limits of well-developed semiconductors such as silicon are approached, interest in wide-bandgap semiconductors, and particularly III–V nitrides, is increasing for a wide range of electrical and optical device applications. The III–V nitrides, e.g., InN, GaN, and AlN, and their solid solutions, are unique among compounds in that they all are characterized by relatively large and direct bandgaps, extreme structural stability, high electron saturation velocities, and high thermal conductivities. These electrical and mechanical qualities of the III–V nitrides have been exploited in the development of, e.g., high-power light emitting diodes (LEDs) in the yellow to ultraviolet spectral range, with blue LEDs now a commercial reality. In addition, III–V nitride injection laser diodes, ultraviolet detectors, and high-power, high-temperature field-effect transistors have been demonstrated and are attracting increasing developmental efforts.

Producibility and reproducibility of the III–V nitride materials used to fabricate these devices are currently the most significant challenges in their development. Perhaps most significantly, bulk substrates of III–V nitride single crystal material are not yet available, and thus quasi-substrate, epitaxial III–V nitride layers must be grown on a foreign growth substrate. But there currently exists no lattice-matched material ideally suitable as a foreign growth substrate. As a result, III–V nitride film growth is typically carried out on a convenient foreign substrate such as sapphire, even though sapphire has a lattice constant significantly different from that of the III–V nitrides.

III–V nitride film growth directly on sapphire or other foreign substrate has been found to result in cracking of the nitride film at film thicknesses above some relatively thin minimum thickness. It is well-recognized, however, that the film quality increases with increased film thickness. In an effort to suppress the cracking condition, it has been suggested to grow the nitride film not on a bare foreign substrate but instead to grow the nitride film on a buffer layer deposited on the substrate. For example, GaN growth processes have been demonstrated in which a GaN layer is grown on a layer of AlN or ZnO which is first deposited on a sapphire growth substrate.

While such growth buffer layers have been shown to somewhat reduce nitride layer cracking such that thicker III–V nitride layers can be grown, they have not been entirely successful, and have not significantly addressed the challenge of further improving the electrical and structural quality of thicker epitaxial layers. One particularly important structural characteristic of the epitaxial layer to be improved is the density of dislocations in the layer; the relatively high dislocation density typical of III–V nitride layers directly impacts the electrical performance of devices fabricated in the layer. For example, dislocations can serve as optical scattering centers in coherent light emitting devices, requiring a higher laser threshold current density. Dislocations also can introduce deep defect energy levels which increase the leakage current of electrical devices fabricated in the layer. Electrical device stability can also be limited at high injection currents due to diffusion of impurities, such as metals, along dislocations.

The degree of surface smoothness of an epitaxial nitride layer is also a critical structural characteristic. Nitride layers having surface morphology such as facets impede the ability to carry out photolithographic processes on the layers for producing devices, and can degrade laser performance by, e.g., broadening the laser emission spectra. Although it is generally r recognized that a higher quality III–V nitride layer can be produced by growing a second or more nitride layers over a first nitride epitaxial layer grown on a foreign growth substrate, it is also well-recognized that the quality of the first nitride epitaxial layer is critical to the quality of any overgrowth nitride layers.

Beyond these considerations for III–V nitride layer quality, the epitaxial growth of such layers on a foreign growth substrate imposes limitations on the operation of devices fabricated in the layers, given that the grown layer remains attached atop the growth substrate. For example, sapphire, the historically most common growth substrate, is electrically insulating, and thus electrical contact to devices fabricated in the nitride layer atop the sapphire substrate can not be made to the backside of the nitride layer through the substrate. More complicated one-sided contact scenarios are thus typically required. In addition, the poor thermal conductivity of sapphire severely limits the ability to adequately cool electrical devices in the upper nitride layer. This poor thermal conductivity is in contrast to the very high thermal conductivity of nitrides such as GaN, and thus impedes the ability to exploit that characteristic of the nitrides.

As advances in III–V nitride-based device applications continue to be made, it is clear that fundamental improvements in the quality and structure of III–V nitride epitaxial layers are necessary to enable the practical realization of the devices and applications.

SUMMARY OF THE INVENTION

The invention provides a III–V nitride growth process which aids in producing a III–V nitride film of high electrical and structural quality. In the process, a pretreatment layer is formed on a growth substrate. Then the pretreatment layer is exposed to a gaseous environment that is thermochemically reactive with the pretreatment layer. After this gaseous environment exposure of the pretreatment layer, there is epitaxially grown on the substrate a nitride layer material defined as $In_xGa_yAl_{1-x-y}N$, where $0 \leq x \leq 1$, $0 \leq y \leq 1$, and $0 \leq x+y \leq 1$. This nitride growth process pretreats the growth substrate to aid in nucleation of the nitride film as it is grown, thereby enabling the production of high quality nitride layers.

The pretreatment layer can consist of, e.g., ZnO, and the thermochemically reactive gaseous environment can consist of, e.g., an HCl-containing gas mixture and/or an $NH_3$-containing gas mixture, at a temperature of, e.g., between about 800° C. and about 1200° C. The pretreatment layer exposure to the gaseous environment can be carried out until the pretreatment layer is substantially decomposed. The nitride layer to be epitaxially grown can be, e.g., GaN, and can be grown by, e.g., a hydride vapor phase epitaxial process. After growth of the nitride layer, the substrate is cooled preferably at a rate of less than about 200° C./minute.

The growth substrate can consists of sapphire or other suitable substrate. In one example, the substrate includes a plane of mechanical weakness that is parallel with a predominant nitride growth surface of the substrate. This plane of mechanical weakness can be inherently exhibited by the substrate or can be produced by processing of the substrate. Additionally, there can be deposited on the substrate a layer of material that is characterized by a plane of mechanical weakness parallel with the predominant nitride growth surface of the substrate. Preferably such a layer is deposited on the substrate after the pretreatment layer has been exposed to the gaseous environment.

The plane of mechanical weakness is exploited during cool down of the substrate, after a nitride layer is grown, to enable the initiation of a fracture mechanism for delaminating the nitride layer from the substrate. Thereby is enabled the production of free-standing nitride layers at the end of the growth process without the need for added processing steps.

The nitride layers produced by the growth processes of the invention can be employed in a wide range of electronic and optoelectronic device applications. For example, short-wavelength light emission devices such as lasers and light emitting diodes, ultraviolet sensors, and other such devices exploiting, e.g., the bandgap of the III–V nitrides, can be microfabricated in the layers. Optical storage, full-color display, and other such applications are thus well-addressed by the invention. Other features and advantages of the growth processes and the resulting III–V nitride layers provided by the invention will be apparent from the claims, and from the following description and accompanying drawing.

DETAILED DESCRIPTION OF THE INVENTION

The growth processes provided by the invention can be applied to the family of III–V nitride compounds, generally of the formula $In_xGa_yAl_{1-x-y}N$, where $0 \leq x \leq 1$, $0 \leq y \leq 1$, and $0 \leq x+y \leq 1$, as well as to ScN or other transition metal or rare earth nitrides, or other suitable semiconducting nitride. The following discussion will predominantly highlight GaN as an example of an epitaxial III–V nitride layer produced in accordance with the invention, but it is to be understood that the invention is not limited to production of a particular nitride.

Historically GaN device development has focused on GaN layers produced by metalorganic chemical vapor deposition (MOCVD), molecular beam epitaxy (MBE), and hydride vapor phase epitaxy (HVPE), all carried out on a foreign growth substrate such as sapphire or silicon carbide. MOCVD and MBE epitaxial growth processes are not generally considered to be optimal for commercially producing relatively thick, quasi-substrate GaN epitaxial layers, however, due to their relatively low growth rates. In contrast, HVPE GaN growth processes are well-characterized as providing a relatively higher growth rate, and thus are the preferred epitaxial nitride growth process in accordance with the invention. MOCVD, MBE, liquid phase epitaxy (LPE), laser ablation, sputtering, vapor transport, sublimation, and other such suitable deposition process can be employed, however; the invention is not limited to a particular nitride deposition or growth technique.

An HVPE process, as the preferred nitride growth technique, is a chemical vapor deposition method carried out preferably in a hot wall reactor at atmospheric pressure. The group III precursors to be employed in the deposition process advantageously can be synthesized within the reactor vessel, preferably upstream from the foreign growth substrate, either by the reaction of a halide-containing gas, such as hydrogen chloride (HCl), with a group III metal, such as Ga, at high temperature, or by reaction of a group V chloride, such as $AsCl_3$ with either a group III metal or a III–V bulk compound. In the case of GaN, gallium chloride $(GaCl_x)$, where $x \leq 3$, can be synthesized in a reactor by reacting HCl gas with liquid Ga metal at a temperature of between about 800° C. and about 1000° C. The synthesized $GaCl_x$ can then be transported to a substrate downstream in the reactor where the $GaCl_x$ is reacted with $NH_3$ at a temperature of between about 800° C.–1200° C. to form GaN, via the reaction:

Because the group III element, here Ga, is transported to the downstream substrate as a volatile halogen compound, here $GaCl_x$, the HVPE growth process can be characterized as chloride-transport vapor phase epitaxy. Due to the relatively low vapor pressure of the metal chloride precursor vapor, the vapor tends to condense on unheated surfaces, thereby motivating the in situ synthesis of the vapor in a reactor operating under hot wall conditions. Such avoids an otherwise complicated vapor delivery and gas inlet heating system required for external precursor vapor synthesis and storage. Additionally, the hydroscopic and corrosive nature of metal halides impedes the practical ability to maintain integrity of a source of presynthesized precursor vapor during storage and processing.

It is recognized that the in situ use of a volatile halogen transport compound such as HCl gas, which is highly corrosive, can quickly destroy reactor equipment if care is not taken to avoid system leaks to air. Accordingly, for some reactor configurations, it may be preferable to employ a presynthesized nitride precursor such as $GaCl_3$ instead of in situ precursor synthesis with HCl gas.

For the case of in situ precursor synthesis, Ga metal can be readily obtained with a purity of more than 99.99% and with a properly designed gas delivery system, HCl gas with a purity approaching more than 99.99% purity can be provided. As a transport gas, HCl is preferred over other candidates such as chlorine gas due to the typically higher purity of HCl gas, and for handling considerations. But it is recognized that chlorine, bromine, iodine, and other such compounds can alternatively be employed.

As can be recognized based on this discussion, while HVPE is the preferred GaN growth technique, reactor operability and safety considerations must be regarded in carrying out the process. This extends to reactor operational temperatures and pressures, as well as gas delivery and exhaust systems. For example, the HVPE epitaxial growth of GaN tends to create copious amounts of $NH_3Cl$, $GaCl_3$, and $GaCl_3 \cdot NH_3$, all of which can condense on and eventually clog reactor exhaust lines unless the exhaust lines are operated at a sufficiently high temperature, e.g., >150° C., and/or operated at a pressure below atmospheric pressure.

The invention provides an HVPE nitride growth reactor that addresses these considerations and that is particularly designed for effective growth of GaN epitaxial films. The nature of the chemistry involved in III–V nitride growth by HVPE processes differs substantially from that of other III–V semiconductors. For example, in GaAs growth by HVPE processes, thermal dissociation of the arsenic compounds results in the formation of $As_4$ and $As_2$ molecules, which typically remain volatile and chemically reactive, and thus which participate in the film growth. In contrast, in GaN growth by HVPE processes, the thermal disassociation of the precursor gas $NH_3$ results in the formation of $N_2$ molecules, which are extremely stable and essentially unreactive at growth temperatures of interest. Indeed, the viability of the HVPE GaN growth process relies on the relatively sluggish disassociation of $NH_3$ to enable the effective transport of reactive nitrogen to the growth surface. But the growth of a stoichiometric, homogeneous GaN film over a large area thus requires the efficient and uniform transport of the $NH_3$ gas to the growth surface. In addition, during an HVPE GaN growth process, there is a strong propensity for gaseous GaN and gas-phase adducts to form, leading to undesirable gas phase reactions, to particulate formation, and to deposition on reactor walls, possibly inducing reactor vessel cracking upon cool down.

Figure 1:
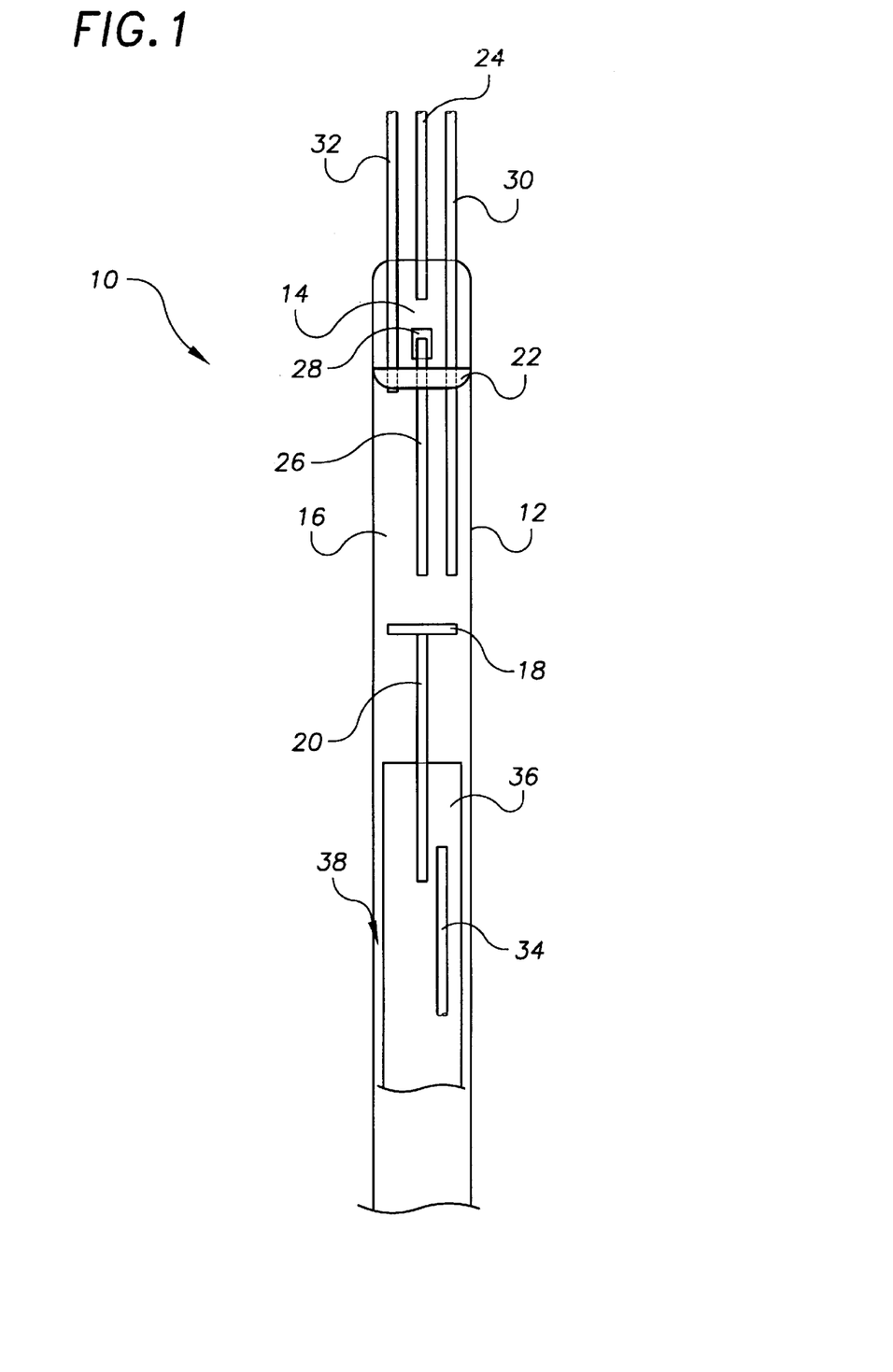
FIG. 1 is a schematic view of a vertical hydride vapor phase epitaxial reactor provided in accordance with the invention for growing epitaxial III–V nitride layers.

Referring to FIG. 1 there is schematically shown a vertical reactor 10 provided by the invention for addressing these various issues in successfully carrying out an HVPE epitaxial layer growth process of a III–V nitride such as GaN. Only the reactor tube assembly 12 is shown for clarity, without the surrounding furnace tube. The tube assembly is configured in a resistively heated furnace tube in the conventional manner, with the furnace also being vertically oriented. The reactor provides two distinct chambers, namely, a precursor synthesis chamber 14 and a growth chamber 16. With this configuration, the Ga precursor for the GaN growth reaction is synthesized in situ in the precursor synthesis chamber 14, upstream of the growth chamber, into which the synthesized precursor is then delivered. The resistive heating configuration is controlled such that the two chambers can be held at substantially different temperatures, thereby enabling simultaneous precursor synthesis and growth processes. In the growth chamber is provided a substrate platen 18 for supporting one or more substrates on which the epitaxial layer is to be grown. Precursor gas synthesized in the precursor chamber 14 is delivered to the growth chamber in the vicinity of the platen to effect the growth process. The substrate platen 18 is supported on a platen rod 20 which preferably can be raised and lowered to enable vertical movement of the substrates into and out of a GaN growth stream, as explained below. The platen rod 20 also preferably enables rotation of the platen during the growth process to enhance uniformity of the growth.

The synthesis and growth chambers are isolated by a boat 22 located at the bottom of the synthesis chamber for holding liquid Ga metal for the precursor synthesis process. The boat edges seal with the reactor tube liner 12 to isolate the chambers. A synthesis gas injector 24 delivers to the precursor synthesis chamber a precursor synthesis gas, e.g., here HCl gas in a dilutent $H_2$ gas, at a point above the liquid Ga metal in the boat 22. The HCl gas reacts with the liquid Ga metal to form gaseous $GaCl_x$ above the surface of the boat. A precursor delivery injector 26 extends from a point above the surface of the boat, down through the boat itself, and into the growth chamber to extract the synthesized $GaCl_x$ gas and deliver it to the growth area. An injector cap 28, shown only schematically, sits atop the precursor delivery injector 26 in a configuration which diverts injected HCl gas away from the delivery injector 26 and down toward the Ga boat while at the same time accommodating exhaust of the synthesized $GaCl_x$ vapor under the cap and through the injector tube 26.

An ammonia injector 30 is configured at the top of the tube to deliver $NH_3$ precursor gas to be reacted with the $GaCl_x$ gas, and to deliver any selected dopant gases, in a carrier gas such as $N_2$, through the synthesis chamber and directly into the growth chamber. As shown in the figure, preferably the precursor delivery injector 26 and the ammonia injector 30 deliver their gases to a common point in the growth chamber just above the substrate platen 18. This configuration minimizes the unwanted gas phase reactions discussed above and enhances the reaction uniformity in the vicinity of the substrates. Downward flow of the reactants to the substrates is facilitated by carrier gases, delivered by a carrier gas injector 32 that is configured at the top of the tube to deliver carrier gases such as $N_2$ and HCl directly into the growth chamber. The carrier gas injector preferably is configured to deliver the carrier gas to a point in the growth chamber upstream from the reactant gas injection point. This enables the establishment of a uniform, laminar flow of carrier gas across the diameter of the growth chamber prior to mixing of the carrier gas with the reactant gases, and accordingly enhances uniformity of film growth across each substrate and from substrate to substrate.

The vertical reactor design further exploits the symmetrical arrangement of the gases' flow paths in the following manner. At the bottom of the reactor tube 12 is provided a counterflow injector 34 in a counterflow tube 36 of a smaller diameter than the overall reactor tube 12. Carrier gases, reactant gases, and growth reaction product gases are exhausted down through an annular exhaust space 38 between the reactor tube 12 and the counterflow tube 36. Upward injection of counterflow gases from the counterflow injector 34 through the counterflow tube 36 impedes exhaust of gases down through the counterflow tube 36. With this configuration, growth reaction product gases can be efficiently drawn downstream from the growth vicinity, around the entire periphery of the tube, thereby minimizing stagnation of reaction product contaminants in the vicinity of the film growth.

In addition, the counterflow injector and tube configuration provides the ability to simultaneously maintain two different and separately equilibrated gas environments within the growth chamber, one environment in the vicinity of the reactant gas injector outputs and the other environment within the counterflow tube. Given that the platen rod 20 is vertically extendible, growth substrates can thus be maintained at a first downstream position and selected gaseous environment in the counterflow tube while reactant gases are equilibrated upstream in the growth chamber. The growth substrates can then be raised upstream to abruptly and precisely control initiation of exposure of the substrates to the reactants, and can be lowered into the counterflow tube to abruptly interrupt or stop growth. During an interruption, a new flow of gas species can be equilibrated in the growth chamber while the substrates are held isothermally out of the reactant stream. As a result of this capability, an entirely in situ growth of multiple and distinct nitride or other layers, as well as in situ substrate pretreatment processes, can be enabled. At the end of a growth process, the substrate platen can be maintained out of the reactant stream and instead in a selected gaseous environment in the counterflow tube as the substrates are cooled.

In the nitride HVPE growth process provided by the invention, nitride growth, e.g., GaN growth, is carried out on a foreign substrate after a pretreatment step that enhances the substrate condition for nitride nucleation at the start of growth process. It is well-recognized that one of the most significant difficulties in growing high-quality III–V nitrides by HVPE, as with other epitaxial growth techniques, is achieving high-quality nucleation on the foreign growth substrate material. In accordance with the invention a wide range of foreign substrates can be employed, including, e.g., sapphire ($Al_2O_3$), spinel ($MgAlO_4$), silicon carbide (SiC), silicon (Si), YAG, GGG ($Gd_3Ga_2[GaO_4]_3$), gallium arsenide (GaAs), titanium nitride, titanium carbide, ScN, InN, AlN, $In_xGa_yAl_{1-x-y}As$, $In_xGa_yAl_{1-x-y}P$ $In_{GayAl1-x-y}N_wAs_zP_{1-w-z}$, or $In_xGa_yAl_{1-x-y}N$, where $0 \leq x \leq 1, 0 \leq y \leq 1$, $0 \leq x+y \leq 1$, $0 \leq w \leq 1, 0 \leq z \leq 1$, and $0 \leq w+z \leq 1$. The growth substrate can also consist of layered structures composed of combinations of these materials, and other such substrates.

Sapphire has historically been the most popular nitride growth substrate and is preferred due to its comparatively low cost, high quality, availability of comparatively large substrate diameter, chemical inertness, and chemical compatibility with the nitride, and particularly GaN growth process. Both c-plane (0001) and r-plane (1–102) sapphire substrates, as well as other orientations of sapphire substrates, can be employed. Although the growth rate of GaN is higher on r-plane sapphire than on c-plane sapphire, GaN growth on r-plane sapphire is oriented with the GaN a-plane (11–20) parallel to the sapphire's r-plane surface, leading to rough, rigid surfaces bounded by (1–100) planes. In contrast, GaN growth on c-plane sapphire is substantially (0001)-oriented and thus is preferred for producing smooth epitaxial layers.

The low surface energy of the c-plane sapphire is found, however, to generally result in relatively poor GaN nucleation, resulting in a somewhat rough epitaxial layer surface morphology, usually dominated by the sapphire surface features and/or contaminants. In the HVPE growth process of the invention, the sapphire surface condition is improved to overcome this quality and render c-plane sapphire substrates more amenable to the GaN nucleation process, thereby producing GaN layers of a higher quality and a smoother surface.

In the HVPE process, the selected foreign substrate is cleaned in a conventional manner. In an example precleaning step, the substrate is held in a solution of sulfuric acid and $H_2O_2$ in a ratio of about 1:1 for between about 3 minutes and 60 minutes, preferably about 20 minutes, to remove organic contaminants from the substrate. The substrate is then rinsed in deionized water and dried by, e.g., spinning or nitrogen jet. In an example cleaning step, the substrate is then etched in a solution of sulfuric acid and phosphoric acid in a ratio of about 3:1 for between about 10 minutes and 120 minutes, preferably about 20 minutes, to etch the surface and remove polishing damage. The substrate is then rinsed in deionized water and dried by, e.g., spinning or nitrogen jet.

In a first deposition step, a pretreatment layer is deposited on the cleaned foreign growth substrate. The pretreatment layer material preferably is selected based on the nitride layer to be grown, and is selected to be a material which can be thermally and/or thermochemically decomposed prior to the nitride growth process. By decomposed is here meant that the material can undergo a thermal and/or thermochemical reaction. Correspondingly, the pretreatment layer is of a thickness which can be decomposed, e.g., ranging from several monolayers to between about 0.01 $\mu$m and about 2 $\mu$m, and preferably not more than about 2 $\mu$m in thickness, but as will be understood, other thicknesses can be utilized effectively, and for some applications, no upper limit in pretreatment layer thickness exists. Given an example HVPE process to be carried out for growing an epitaxial GaN layer, a pretreatment layer of ZnO, Bi, GaAs, InN, or other suitable pretreatment layer material can be employed.

In one example process, a pretreatment layer of ZnO is deposited on the selected foreign substrate, such as a sapphire substrate. The ZnO layer can be deposited by any suitable process, including conventional sputtering, magnetron sputtering, molecular beam epitaxial processes, chemical vapor deposition (CVD) including thermal, plasma enhanced, organo-metallic, and other CVD processes, liquid, e.g., spin-on, deposition techniques, vapor transport processes, and other suitable deposition processes. For many applications, conventional sputtering may be preferable due to is comparatively low cost, reproducibility, and uniformity.

In an example ZnO sputtering deposition step in accordance with the invention, cleaned sapphire substrates are loaded into a conventional RF-diode sputtering machine, e.g., a Perkin-Elmer model 2400 sputtering machine, and the sputtering chamber is pumped down to a level of vacuum below at least about $5 \times 10^{-7}$ Torr. A conventional hot-pressed ZnO disk is employed as the sputtering target. As is conventional, a presputter, target conditioning step is preferably carried out to clean the sputtering target surface and equilibrate the target surface stoichiometry. During such a presputter step, the substrates are preferably shielded or moved out of the sputter environment, in the conventional manner.

To carry out the ZnO sputter deposition step, an oxygen flow of, e.g., between about 2 sccm and about 20 sccm, preferably about 8.48 sccm, and an argon flow of, e.g., between about 5 sccm and about 200 sccm, preferably about 53.3 sccm, is established. Other gas species can be employed as found suitable. As can be recognized, the specific gas flows to be used are dependent on sputter chamber geometry and vacuum pump capability. The gas flows just given are optimized for a sputter system with an 850 l/s turbomolecular pump and a 5 inch-diameter cathode. The pump includes a throttle for enabling pump control during the sputter. The sputter power level is set at a power density suitable for the sputter cathode size, e.g., between about 0.2 $W/cm^2$ and 15 $W/cm^2$, preferably about 1.4 $W/cm^2$, i.e., about 175 W for a 5 inch-diameter cathode.

The ZnO sputter step is carried out to produce a ZnO pretreatment layer of about 0.25 $\mu$m in thickness, but other ZnO thicknesses can be utilized. Once the sputter process is halted, the sapphire substrates are cooled and removed from the sputtering system.

At this point, it is preferred that a second cleaning step be carried out as needed to remove any particulates or other contaminants from the pretreatment layer. For example, the substrates can be cleaned in methanol, ethanol, propenol, or other suitable alcohol in an ultrasonic bath for, e.g., between about 10 minutes and 30 minutes. The substrates are then dried by, e.g., spinning or nitrogen jet.

Next is carried out a pretreatment layer decomposition step prior to the nitride, here GaN, growth. Although this decomposition process can be carried out in any suitable scenario, it is preferred that such be carried out in situ in the HVPE growth reactor just prior to the GaN growth step to provide a clean growth surface, to minimize surface defects, and to enhance growth process efficiency.

In general, the pretreatment layer decomposition step is carried out by subjecting the pretreatment layer to a gaseous environment that is thermochemically reactive with the pretreatment layer material, i.e., a temperature and gas mixture that thermally and/or thermochemically reacts with the layer. In an example process, the sapphire substrates having a ZnO pretreatment upper layer are first loaded into an HVPE growth reactor, preferably a vertical reactor such as that of FIG. 1, by positioning the substrates on the substrate platen (18 in FIG. 1) and holding the platen at a position in the reactor tube below the heated regions of the reactor furnace. The growth chamber 16 of the reactor tube 12 and the counterflow tube 36 are then purged of air by the injection of an inert gas such as nitrogen or hydrogen through the synthesis gas injector 24, precursor injector 26, ammonia injector 30, carrier gas injector 32, and counterflow injector 34.

Next the substrates are preheated to a decomposition temperature which preferably is about that of the GaN growth process. For the vertical reactor configuration, this is preferably accomplished by raising the substrate platen 18 into the heated region of the reactor tube and specifically, into the counterflow tube. Preferably, the substrates are slowly preheated so that thermal shock of the substrates does not occur. This is accomplished by slowly raising the substrate platen into the counterflow tube. For the GaN growth process provided by the invention, the substrates are preferably heated to a GaN growth temperature of between about 800° C. and about 1250° C., preferably about 1050° C., during a substrate temperature ramp time of between about 3 minutes and about 10 minutes that is imposed by the rate at which the substrate platen is raised into the counterflow tube. As can be recognized, the decomposition temperature does not need to be the same as the GaN growth temperature, however.

During the substrate heating process, as the substrates are raised in the counterflow tube, an inert gas is supplied by the counterflow injector 34 to maintain an inert atmosphere around the substrates. For example, $N_2$ can be injected into the counterflow tube at a flow of between about 0.5 l/min and about 5 l/min, preferably about 4 l/min, during the substrate heating process. As the substrate temperature is increased, the substrate platen preferably is rotated, e.g., at a rate of between about 5 rpm and about 60 rpm, preferably between about 20 rpm and about 30 rpm.

As the substrates are heated, a thermochemically reactive gaseous environment is equilibrated upstream in the growth chamber 16 of the reactor tube 12. The mix of gases selected for this environment is one which can react with the pretreatment layer on the foreign growth substrate. For example, given a ZnO pretreatment layer, the decomposition gases can include HCl and/or $NH_3$, which are well-characterized ZnO etchants, along with carrier gases of $N_2$ and $H_2$. In one example process provided by the invention, a flow of HCl gas of between 0 l/min and about 1 l/min, preferably about 0.03 l/min; a flow of $NH_3$ gas of between 0 l/min and about 10 l/min, preferably about 0.8 l/min; a flow of $N_2$ gas of between about 1 l/min and about 20 l/min, preferably about 3.4 l/min, and a flow of $H_2$ gas of between 0 and about 10 l/min, preferably about 0.1 l/min, is equilibrated in the growth chamber as the substrate temperature is ramped up to the growth temperature. The various gases are delivered to the growth chamber via the precursor and ammonia gas injectors in the manner described above.

Once the growth temperature is attained, the substrate platen is moved upstream out of the counterflow tube and into the growth chamber (16 in FIG. 1) to initiate reaction of the gases with the pretreatment layer. The substrate is maintained in this equilibrated gas flow for a time sufficient to react with the pretreatment layer to, e.g., decompose the layer, depending on the layer material, e.g., for between about 2 seconds and about 240 seconds, preferably about 10 seconds. It is to be recognized that the preferred reaction time can vary with selected pretreatment material and thickness; the time range given here is specified for a ZnO pretreatment layer of about 0.3 μm in thickness. During the pretreatment layer reaction process, the substrate platen preferably is rotated, e.g., at about 20 rpm.

Without being bound to theory, it is expected that a thermal or thermochemical reaction of the gases with the pretreatment layer during this reaction can result, for some materials, in the decomposition of the pretreatment layer, possibly by a combination of thermal desorption and gas phase etching or other mechanism. At the end of the decomposition process, the pretreatment layer may be substantially entirely decomposed, but several monolayers of the pretreatment layer are likely to remain, due to substrate surface energy effects. Then during the proceeding nitride, e.g., GaN, growth process, the remaining pretreatment monolayers may modify the surface properties of the sapphire substrate surface to enhance GaN nucleation. For example, the pretreatment monolayers may change the lattice mismatch accommodation between the sapphire and the GaN or may change the surface polarity of GaN during nucleation, leading to a more favorable growth "mode." Other phenomena relating to tailoring of surface properties may also take place. For example, substrate surface polish damage may be removed, residual substrate contaminants may be removed, or other substrate conditioning may be accomplished. Considering other mechanisms and pretreatment layers, e.g., a Bi pretreatment layer, such may act as an attractive "surfactant" to GaN precursor gases, whereby the gases dissolve through any remaining Bi layer and crystallize on the underlying substrate.

During the pretreatment layer decomposition step, synthesis of the $GaCl_x$ precursor can be initiated in the precursor synthesis chamber (14 in FIG. 1) of the reactor tube. In one example process, the synthesis gas HCl is injected into the synthesis chamber at a flow rate of between about 3 sccm and about 30 sccm, preferably about 7 sccm, with some amount of carrier gas, e.g., $H_2$ and $N_2$, as described above.

In one example GaN growth process, the gases flowing to the growth chamber are maintained in the composition set for the pretreatment layer decomposition process, and the injection of synthesized $GaCl_x$ gas from the synthesis chamber is initiated. This scenario aids in efficient growth and thus it is evident that a pretreatment layer decomposition process that is carried out at the GaN growth temperature and with at least a subset of the growth gases is preferable. During GaN growth, the inclusion of HCl gas directly into the growth chamber along with the synthesized $GaCl_x$ gas is found to be preferable in that the additional HCl increases the ratio of Cl to Ga at the substrate growth surface. This is found to enhance the rate of lateral growth of GaN as the GaN nucleates, resulting in the growth of larger size grains and possibly resulting in enhanced desorption of impurities at the growth surface. The additional HCl gas is found to generally have only a moderate effect on reduction in GaN growth rate.

The GaN growth step is continued until a GaN epitaxial layer of sufficient thickness is produced. For the growth gas flows given above in the vertical reactor of FIG. 1, a growth rate of between about 20 μm/hour and about 200 μm/hour can be achieved. Uniformity of the growth is preferably aided, e.g., by rotating the substrate platen at a rate of, e.g., about 20 rpm. During the nitride growth step, it is preferable to continue flowing an inert gas such as $N_2$ at a rate of, e.g., about 4 l/min up through the counterflow injector in the counterflow tube to force exhaust gases down through the annular exhaust space between the reactor liner tube and the counterflow tube and to maintain an inert environment in the counterflow tube.

About two minutes prior to the designated nitride growth termination, flow of $NH_3$ gas is added to the gas flow in the counterflow tube, through the counterflow injector, to equilibrate an $NH_3$ gas environment in the counterflow tube for the substrate cool-down step. To terminate GaN growth, the substrate platen is then lowered out of the growth stream in the growth chamber and down into the flow of $NH_3$ and $N_2$ in the counterflow tube. The temperature of the substrates is then decreased by slowly lowering the substrate platen in the counterflow tube out of the heated region of the furnace. Preferably the substrate temperature decrease is low enough to ensure that temperature differences across the GaN layer do not induce cracking of the layer. The substrate cooling rate preferably is between about 1° C./min and about 200° C./min, most preferably about 100° C./min.

It is preferable to cool the substrates in the $NH_3$ environment to suppress decomposition of the GaN layer during the cool-down, but if such is not a concern, the substrates can be cooled in any suitable environment. GaN will generally not decompose at temperatures less than about 600° C. and thus, once this substrate temperature is reached, the flow of $NH_3$ can be cut off and any suitable gas flow, e.g., $N_2$, can thereafter be maintained in the counterflow tube during the remainder of the cooling process.

Once the substrates are cooled and removed from the reactor, they can be further processed by, e.g., growth of one or more GaN layers by MBE, MOCVD, or HVPE on top of the GaN epitaxial layer. The sapphire substrate can be removed from the GaN epitaxial layer by, e.g., etching in phosphoric acid or other suitable etchant, by electrochemical polishing, or by other suitable process.

While for some applications removal of the sapphire substrate may not be necessary, it is recognized in accordance with the invention that for many applications a free-standing GaN layer is preferred and an efficient process for producing such is correspondingly preferred. In accordance with the invention, the pretreatment layer deposition, pretreatment layer decomposition, and GaN growth can be carried out on a growth substrate which is either inherently or intentionally engineered to exhibit a mechanical weakness, in a plane parallel to the predominant growth surface, of sufficient magnitude to promote a mechanical failure along that plane, and to result in delamination of the epitaxial nitride layer due to thermal stress produced as the substrate and nitride layer are cooled after the nitride growth. Here the predominant substrate growth surface is meant to refer to that substrate surface on which the nitride layer is predominantly grown, e.g., the elongated top or bottom surface of the substrate.

Given that a difference in thermal expansion coefficient exists between the growth substrate and the epitaxial nitride layer, as is typically the case, strain between the nitride layer and the substrate generally is produced during cool down of the substrate assembly; during cool down, the substrate and epitaxial materials will contract, as they cool, to differing degrees, depending on the difference between their thermal expansion coefficients. The resulting strain between the GaN layer and the underlying substrate induces a mechanical fracture mechanism along the substrate's parallel plane of weakness, resulting in an automatic separation of the GaN layer from the growth substrate.

The cool-down fracture and delamination mechanism is particularly advantageous in that it provides a process of stress release alternate to one of cracking through the thickness of the GaN layer, thereby enabling the formation of thick, crack-free, as well as free-standing, GaN layers. Because the GaN layer delamination generally can be expected to occur near to the growth temperature, a GaN layer cracking mechanism is inherently suppressed.

In accordance with the invention, suitable foreign substrates for promoting automatic GaN layer delamination include, e.g., micaceous, i.e., layered or graphitic, materials such as $ScMgAlO_4$, and the class of mica materials. Generally, the mica structure is characterized as sheets of tetrahedra which sandwich sheets of edge-sharing octahedra. Between each sandwich there are interlayer sites of large cations. The general formula for micas is $XY_{2-3}Z_4O_{10}(OH)_2$, where X represents the interlayer site, Y represents the octahedral sites, and Z represents the tetrahedral sites. Some example mica materials which can be employed as growth substrates include $KMg_3[AlSi_3]O_{10}(OH)_2$ (phlogopite); $KFe_3[AlSi_3]O_{10}(OH)_2$ (annite); $K[Mg_2Al][Al_2Si_2]O_{10}(OH)_2$ (eastonite); and $NaMg_3[AlSi_3]O_{10}(OH)_2$ (wonesite). Of these example micas, phlogopite is preferred as it is the most refractory of the class. Other suitable substrates include hexagonal BN, graphite, and other suitable substrates.

The invention also provides a process whereby generally any selected growth substrate can be processed to produce mechanical features in the substrate for locally weakening the substrate in a plane parallel with the predominant growth surface; the mechanical features impose a parallel plane weakness to enable a GaN layer delamination from the substrate due to thermal stresses. In one example process in accordance with the invention an ion implantation process is carried out to produce a sub-surface region of high defect density under a thin and high-quality surface region of the selected growth substrate. For example, hydrogen implantation into a silicon wafer, at a high implantation dose, and subsequent anneal of the implanted silicon wafer, can be carried out to produce a highly-damaged subsurface silicon layer underlying a single crystalline silicon nitride growth surface. In an HVPE nitride growth cool down step, the defective silicon sub-surface layer acts as a fracture plane at which delamination can occur. This technique of sub-surface defect production is particularly advantageous in that it provides a high-quality nitride growth surface as well as a fracture plane.

In other techniques for producing a plane of mechanical weakness, a foreign substrate can be mechanically and/or chemo-mechanically thinned. Given a substantially thinned growth substrate, fracture of the substrate is likely to occur before cracking of a nitride layer as the substrate and layer are cooled. In one substrate thinning scenario, the substrate is bulk-etched to produce a very thin substrate membrane on the surface of which is grown the nitride layer. Well-known bulk etch techniques for silicon, silicon carbide, sapphire, or other suitable growth substrate can be here employed. Growth of a thick HVPE nitride film on the substrate membrane results in fracture of the membrane, and delamination of the GaN layer. In other techniques, a wafer-bonding process can be employed to produce an assembly of layers, one of which is engineered to be a fracture layer, preferably located beneath a high-quality crystalline growth surface. For example, a silicon-on-insulator wafer can be bonded to a silicon wafer and thinned to produce a single crystalline surface layer overlying a silicon dioxide fracture layer.

In other suitable substrate conditioning processes, the surface of the substrate can be lithographically patterned to include topology that renders a plane parallel to the growth surface in a mechanically weakened condition. Other substrate conditioning processes can be employed, preferably such that a plane of mechanical weakness is produced near to the growth surface.

Whether a substrate of inherent parallel plane weakness or one having an engineered plane of weakness is employed, it is preferred that the pretreatment layer deposition and decomposition process described above be carried out prior to the nitride growth on the substrate to enhance the quality of the nitride nucleation and growth. Because the surface of a foreign substrate having a mechanical weakness typically exhibits low surface energy, homogeneous nucleation of a nitride layer on the substrate surface can be difficult. The pretreatment layer decomposition process provided by the invention substantially improves this surface condition to enable the growth of a high-quality nitride layer on the substrate. In addition, because the pretreatment process enhances the homogeneity of the nitride layer, the pretreatment process can enhance uniformity of the nitride layer fracture from the substrate.

The GaN growth process parameters described above can be applied directly to a process employing a weakened foreign substrate. During the cool down process given above, stresses introduced between the epitaxial nitride layer and the growth substrate are absorbed at the substrate plane of mechanical weakness, resulting in a fracture in the vicinity of the plane, and delamination of the GaN layer from the substrate. The resulting free-standing GaN layer can then itself be employed as a substrate material for device fabrication or for subsequent overgrowth of one or more layers in which devices are fabricated.

In a further process provided in accordance with the invention, any suitable growth substrate can be employed for the nitride growth, and a thin graphitic-like interlayer is deposited on the substrate surface, preferably after the pretreatment layer deposition and decomposition and before the initiation of nitride growth, to induce delamination of the nitride epitaxial layer, after its growth, from the thin interlayer as the substrate and layers are cooled down at the end of the nitride growth process.

Preferably the thin interlayer consists of a material or combination of materials that are characterized bv a graphitic-like sheet structure which exhibits a mechanical weakness in a plane parallel to the plane of nitride, e.g., GaN, growth on the interlayer. During the controlled cool down process, thermal stresses at the interlayer heterojunctions with the GaN layer and the underlying substrate induce a fracture in the vicinity of the interlayer. Given that the bonding between intralayers of a typical graphitic-like interlayer material is generally characterized as being extremely weak, the induced fracture results in a delamination, between the GaN layer and the interlayer, within the interlayer, or between the interlayer and the foreign substrate. Preferably the interlayer material is selected to be sufficiently weak that the fracture and delamination process is localized to the interlayer region, but the fracture does not need to occur at the actual interlayer-GaN interface or the interlayer-substrate interface. The point of fracture and delamination is preferably close to the interlayer-GaN interface so that any interlayer material remaining on the underside of the free-standing GaN layer is sufficiently thin so as not to introduce substantial cracking of the GaN layer.

In accordance with the invention, materials such as BN, graphitic carbon, one of the mica materials, $ScAlMgO_4$, or other material having a layered crystal structure can be employed as the interlayer material.

For some applications BN or another nitride may be a preferred interlayer material for an epitaxial nitride growth process. Here a subset of the growth gases can be employed for depositing the BN interlayer, thus enabling an in situ deposition process. It is recognized, however, that the interlayer, e.g., a BN interlayer, can be deposited by a wide range of processes, e.g., by sputtering, CVD, MOCVD, MBE, or other suitable process. The interlayer deposition does not necessarily need to be carried out in situ with the nitride epitaxial growth process, but such is preferred to increase process efficiency and reduce contaminants.

In one example BN interlayer deposition technique provided by the invention, the ZnO pretreatment layer deposition and pretreatment layer decomposition processes are first carried out as described above, e.g., on a sapphire growth substrate. Then the BN interlayer is deposited by a HVPE process in situ immediately following the pretreatment layer decomposition process. At the termination of the pretreatment layer decomposition step, the pretreatment gas flow to the growth chamber is maintained and the substrate platen position in the growth chamber is maintained. $BCl_3$ gas is added to the gas flow, e.g., at a flow rate of between about 0.5 sccm and about 10 sccm, preferably about 1 sccm, to commence the deposition of a thin BN interlayer on the pretreated substrate. Preferably, the interlayer is no more than about 1000 Å in thickness, and thus the BN interlayer deposition requires between about 2 seconds and 8 seconds for the gas flows given above.

To terminate the BN interlayer deposition, the $BCl_3$ gas flow is terminated while the decomposition gas flow to the growth chamber is maintained. A purge period of a suitable time, e.g., between about 0.5 minute and 2 minutes, preferably about 1 minute, is then carried out to purge the growth chamber of the $BCl_3$ gas flow. During this purge period the substrate platen can be maintained in the growth chamber or can be lowered into the counterflow tube to isolate the substrates from the reactive gases. Preferable the substrate platen is lowered into the counterflow tube during the purge period with the counterflow injector injecting an inert gas such as $N_2$ into the counterflow tube. During the purge period, the in situ synthesis of the $GaCl_x$ precursor gas can be initiated in the synthesis chamber, if such has not been initiated during the pretreatment layer decomposition step.

With the BN layer deposited and the growth chamber purged of B species, the growth of a GaN epitaxial layer can then be initiated using the growth parameters given above. As discussed above, at the termination of the GaN growth, cool down of the substrates is preferably carried out in the counterflow tube and in an environment of $NH_3$ to suppress decomposition of the GaN layer. During the substrate cooling, a fracture in the region of the BN interlayer occurs, resulting in the delamination of the GaN layer from the underlying foreign substrate prior to the complete cool down. The resulting GaN layer is a free-standing substrate, as described above, in which devices can be fabricated or on which further GaN or other material overgrowth can be carried out.

With the proper selection of pretreatment layer material and pretreatment layer decomposition gases, a second pretreatment layer can be grown on the thin interlayer and decomposed just prior to the GaN growth on the interlayer using the process described above. This second pretreatment layer and decomposition step, like the first pretreatment layer and decomposition step, is intended to aid in homogeneous GaN nucleation and to aid in accommodation of lattice mismatch between the interlayer and the GaN layer. In an alternative process, a second interlayer can be grown atop the first interlayer to promote effective nitride nucleation and growth. For example, a ZnO layer can be deposited by, e.g., a sputtering process, on the first inter layer, and maintained without subjection to a decomposition step as a nitride growth surface. The invention is not limited to a specific arrangement of layers above or below the fracture interlayer.

The following examples demonstrate the nitride growth processes described above.

EXAMPLE 1

A c-plane-oriented sapphire substrate of about 2 inches in diameter was ranging precleaned in a solution of sulfuric acid:$H_2O_2$ 1:1 solution for about 20 minutes to remove organic contaminants from the substrate. The substrate was then rinsed in deionized water and dried by nitrogen jet. In a substrate cleaning procedure, the substrate was then etched in a solution of sulfuric acid: phosphoric acid 3:1 solution for about 20 minutes to etch the surface and remove polishing damage. The substrate was then rinsed in deionized water and dried by nitrogen jet.

The substrate was loaded into an RF-diode sputtering machine equipped with a hot pressed ZnO target and the sputter chamber was pumped down to a vacuum level better than about $5 \times 10^{-7}$ Torr. The sputter power was set at about 175 W, given the 5 inch-diameter cathode, and a gas flow of about 8.48 sccm of $O_2$ and about 53.3 sccm of Ar was initiated. Prior to ZnO sputter deposition, a 20 minute-long presputter step was carried out to clean the target surface and equilibrate the target surface stoichiometry. The substrate was shielded during this presputter step. A ZnO layer of about 0.3 µm was then sputtered onto the substrate. At the termination of the sputter step, the substrate was cooled and removed from the sputter system. The ZnO-coated substrate was then ultrasonically cleaned in methanol to remove particulates. The substrate was then dried by nitrogen jet.

The substrate was loaded onto the platen of the vertical reactor described above and shown in FIG. 1, and the platen was positioned in the counterflow tube out of the heated region of the reactor furnace. $N_2$ was introduced through all tube injectors, including the counterflow injector, for about 30 minutes, to purge the tube assembly of air. Then the substrates were raised in the counterflow tube to the heated region of the furnace, which was set at a temperature of about 1050° C. in the growth chamber and about 850° C. in the precursor synthesis chamber. The substrate platen was raised such that the substrate temperature increased at about 100° C./min up to about 1050° C. As the substrates were raised in the counterflow tube, the substrate platen was rotated at about 20 rpm.

During this time. gases in the precursor synthesis chamber and the growth chamber were equilibrated. Gas delivery to the growth chamber was set as follows: $NH_3$ flow at about 1000 sccm, and HCl flow at about 30 sccm. Gas delivery to the precursor synthesis chamber was set as a flow of HCl at about 5 sccm. A $N_2$ flow of about 3400 sccm and a $H_2$ flow of about 100 sccm was divided between the two chambers as carrier gases. The liquid metal boat in the precursor synthesis chamber was previously filled with about 200 g–300 g of liquid metal Ga of greater than about 99.999% purity. The loaded Ga boat was held in position in the synthesis chamber to effect the synthesis of $GaCl_x$ and the deposition of GaN by reaction with the $NH_3$ in the growth chamber.

Once the substrate growth temperature was reached and gas flow to the growth chamber was equilibrated, the substrate was raised out of the counterflow tube to the stream of gases to carry out a pretreatment layer decomposition step. At this point, substantially no $GaCl_x$ precursor gas is yet to be synthesized and injected into the growth chamber, and thus only the gases directly injected to the growth chamber are present there for reaction with the pretreatment layer. The substrate was maintained in this position for about 10 seconds. At that point, $GaCl_x$ precursor from the precursor synthesis chamber was injected into the growth chamber to end the pretreatment layer decomposition step and to initiate growth of GaN. The temperature and gas mixture in the growth chamber was maintained from the decomposition step into the GaN growth process. The substrate platen was rotated at a rate of about 20 rpm during both the pretreatment layer reaction and the GaN growth.

The GaN growth was continued for about 3 hours. During that time, $N_2$ was continuously injected into the counterflow tube. Then about two minutes prior to the growth termination, a flow of about 200 sccm of $NH_3$ was added to the counterflow tube. At the termination of GaN growth, the substrate was lowered into the counterflow tube and then slowly lowered out of the heated region of the furnace to impose a substrate cool down rate of between about 50° C. and 100° C. The substrate platen was rotated at a rate of about 20 rpm as the substrate was cooled. Once cooled to a temperature of less than about 100° C., the substrate was removed from the reactor.

The growth process resulted in a GaN epitaxial layer of about 74 µm in thickness; the GaN layer was smooth and transparent. Cross-sectional transmission electron microscopy (TEM) revealed that no ZnO was detectable at the interface between the GaN and the sapphire substrate, indicating that the ZnO pretreatment layer was substantially entirely decomposed. The GaN-sapphire interface was found to be devoid of the typically defective interface generally associated with GaN films grown directly on a sapphire substrate without any pretreatment layer deposition and decomposition. The dislocation density of the GaN film was about $10^8$ cm$^{-2}$, the room temperature peak Hall mobility was about 920 cm$^2$/V-s, and the carrier concentration was about $7 \times 10^{16}$ cm$^{-3}$. The low dislocation density, high mobility, and smooth surface of the GaN layer indicated its high quality and corresponding suitability for fabrication of electronic and optoelectronic devices.

EXAMPLE 2

A substrate of $ScMgAlO_4$ of about 2 cm in diameter was cleaned following the procedure given in Example 1, and a 0.4 µm-thick ZnO layer was sputter-deposited on the substrate following the procedure given in Example 1. A 10 second ZnO layer decomposition step was then carried out at a temperature of about 1050° C. in the HVPE reactor of FIG. 1, following the procedure given in Example 17 with the exception of the $NH_3$ gas flow to the growth chamber being about 800 sccm instead of about 1000 sccm. A GaN epitaxial layer was grown over the pretreated $ScMgAlO_4$ substrate in a two step procedure; during the first step, of about 60 minutes in duration, the HCl flow to the precursor synthesis chamber was set at about 7 sccm, while during the second step, of about 64 minutes in duration, the HCl flow to the precursor synthesis chamber was set at about 10 sccm. The other gas flows were maintained as given in Example 1 and with an $NH_3$ gas flow as given above, during both growth steps.

The first growth step was set at a lower growth rate than the second growth step to control nucleation, given an expectation of relatively low substrate surface quality. At the termination of the second growth step, the substrate was cooled following the procedure of Example 1. Upon inspection, it was found that the GaN layer, of about 80 μm in thickness, was partially delaminated from the ScMgAlO$_4$ substrate, producing frees-tanding GaN pieces of about 3 mm×3 mm in size. It was believed that some amount of the substrate might have delaminated with the GaN epitaxial layer and was attached to the underside of the epitaxial layer. These results indicated that the graphitic-like structure of the substrate was effective in producing free-standing GaN layers.

EXAMPLE 3

A sapphire substrate of about 2 inches in diameter was cleaned following the procedure given in Example 1, and a 0.38 μm-thick ZnO layer was sputter-deposited on the substrate following the procedure given in Example 1. A 10 second ZnO layer decomposition step was then carried out at a temperature of about 1050° C. in the HVPE reactor of FIG. 1, following the procedure given in Example 2. At the end of the decomposition step, a BN layer of less than about 1000 Å was deposited over the pretreated substrate by introducing a BCl$_3$ gas flow of about 10 sccm to the growth chamber. The gas flow was maintained for about 2 seconds, after which the gas flow was valve was closed but the deposition was continued for about 48 additional seconds.

At the end of the BN deposition step, the substrate platen was lowered into the counterflow tube, where N$_2$ was flowing as in Example 1. A purge period of 30 seconds was carried out to exhaust any remaining BCl$_3$ out of the growth chamber. During the BN deposition and the purge period, the GaCl$_x$ synthesis conditions were equilibrated in the synthesis chamber with a flow of HCl of about 20 sccm to the synthesis chamber. After the 30 second purge period, the substrate platen was again raised into the growth gas stream to initiate GaN epitaxial growth over the BN layer. The GaN growth was carried out for about 120 minutes, after which the substrate was cooled following the procedure of Example 2.

Upon inspection it was found that several free-standing GaN layers, each of about 200 μm in thickness and about 1 inch-square, were produced by the process. The dislocation density of the pieces was about 10$^8$ cm$^{-2}$. The GaN layer surface was found to not be substantially as smooth as that of layer of Example 1. These results indicated that the graphitic-like structure of the deposited BN interlayer was effective in producing free-standing GaN layers.

As can be recognized from the discussion above and from the recited experimental examples, a wide range of process parameters can be accommodated by the nitride growth processes provided by the invention. Indeed, the pretreatment layer deposition and decomposition techniques and the substrate and interlayer fracture techniques provided by the invention can be employed in many growth and deposition processes to enhance growth quality and to enable the production of free-standing layers. Accordingly, it is to be understood that the protection sought to be afforded hereby should be deemed to extend to the subject matter of the claims and all equivalents thereof fairly within the scope of the invention.

I claim:

1. A method for producing a nitride layer, comprising the steps of:
   forming a pretreatment layer on a growth substrate;
   exposing the formed pretreatment layer to a gaseous environment that is thermochemically reactive with the pretreatment layer; and
   after the gaseous environment exposure of the pretreatment layer, epitaxially growing on the substrate a nitride layer material defined as In$_x$Ga$_y$Al$_{1-x-y}$N, where $0 \leq x \leq 1; 0 \leq y \leq 1$; and $0 \leq x+y \leq 1$.

2. The method of claim 1 wherein the step of forming a pretreatment layer comprises depositing a layer of ZnO.

3. The method of claim 1 wherein the nitride layer material epitaxially grown is GaN.

4. The method of claim 3 wherein the step of epitaxially growing a layer of GaN comprises growing a GaN layer by hydride vapor phase epitaxy.

5. The method of claim 4 wherein the step of forming a pretreatment layer comprises depositing a layer of ZnO.

6. The method of claim 5 wherein the thermochemically reactive gaseous environment comprises an HCl-containing gas mixture at a temperature between about 800° C. and about 1200° C.

7. The method of claim 5 wherein the thermochemically reactive gaseous environment comprises an NH$_3$-containing gas mixture at a temperature between about 800° C. and about 1200° C.

8. The method of claim 1 wherein the step of exposing the pretreatment layer to a thermochemically reactive gaseous environment is carried out until the pretreatment layer is substantially decomposed.

9. The method of claim 1 wherein the growth substrate comprises sapphire.

10. The method of claim 1 wherein the growth substrate comprises a plane of mechanical weakness parallel with a predominant nitride growth surface of the substrate, and further comprising a last step of cooling the substrate, after growth of the nitride layer, at a rate less than about 200° C./minute.

11. The method of claim 10 wherein growth substrate comprises ScMgAlO$_4$.

12. The method of claim 1 further comprising a first step of processing the growth substrate to produce a substrate plane of mechanical weakness parallel with a predominant nitride growth surface of the substrate, and further comprising a last step of cooling the substrate, after growth of the nitride layer, at a rate less than about 200° C./minute.

13. The method of claim 1 further comprising the steps of:
   after the gaseous environment exposure of the pretreatment layer, forming on the substrate a layer of material characterized by a plane of mechanical weakness parallel with a predominant nitride growth surface of the substrate; and
   a last step of cooling the substrate, after growth of the nitride layer, at a rate less than about 200° C./minute.

14. The method of claim 13 wherein the layer of material characterized by a plane of mechanical weakness comprises a layer of BN.

* * * * *